(12) United States Patent
Lee

(10) Patent No.: US 7,701,266 B2
(45) Date of Patent: Apr. 20, 2010

(54) CLOCK SYNCHRONIZATION CIRCUIT AND CLOCK SYNCHRONIZATION METHOD

(75) Inventor: Seong Jun Lee, Chungcheongbuk-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 138 days.

(21) Appl. No.: 11/964,821

(22) Filed: Dec. 27, 2007

(65) Prior Publication Data

US 2009/0115474 A1 May 7, 2009

(30) Foreign Application Priority Data

Nov. 2, 2007 (KR) ............... 10-2007-0111368

(51) Int. Cl.
*H03L 7/00* (2006.01)
(52) U.S. Cl. .............. 327/143; 327/149; 327/158; 327/161
(58) Field of Classification Search ......... 327/141–143, 327/147, 149, 156, 158, 161–163
See application file for complete search history.

(56) References Cited

U.S. PATENT DOCUMENTS

| 6,456,130 | B1 * | 9/2002 | Schnell | 327/156 |
| 6,665,219 | B2 * | 12/2003 | Li et al. | 365/194 |
| 7,348,819 | B2 * | 3/2008 | Choi | 327/158 |
| 7,352,218 | B2 * | 4/2008 | Choi | 327/156 |
| 7,388,415 | B2 * | 6/2008 | Lee | 327/158 |
| 7,430,143 | B2 * | 9/2008 | Choi | 365/194 |
| 7,501,866 | B2 * | 3/2009 | Choi | 327/156 |
| 2009/0015302 | A1 * | 1/2009 | You | 327/158 |

FOREIGN PATENT DOCUMENTS

| KR | 1020000021346 A | 4/2000 |
| KR | 1020020002619 A | 1/2002 |
| KR | 2007-0036547 A | 4/2007 |
| KR | 1020070035943 A | 4/2007 |

* cited by examiner

*Primary Examiner*—Lincoln Donovan
*Assistant Examiner*—Patrick O'Neill
(74) *Attorney, Agent, or Firm*—Ladas & Parry LLP

(57) ABSTRACT

A clock synchronization circuit and a clock synchronization method which generate an internal clock synchronized to an external clock is presented. The circuit and method include a clock enable control circuit generating a clock enable control signal controlled by a power supply voltage and a power-down signal. The circuit and method also include a clock generating circuit receiving an input clock which selectively generates an internal clock synchronized to an external clock using the input clock using the clock enable control signal. Whereupon, a locking failure can be prevented by performing a phase update operation selectively in accordance with whether the power supply voltage is varied or not in the power-down mode. Furthermore, current consumption can be reduced by controlling phase update time in accordance with a variable magnitude of the power supply voltage.

25 Claims, 9 Drawing Sheets

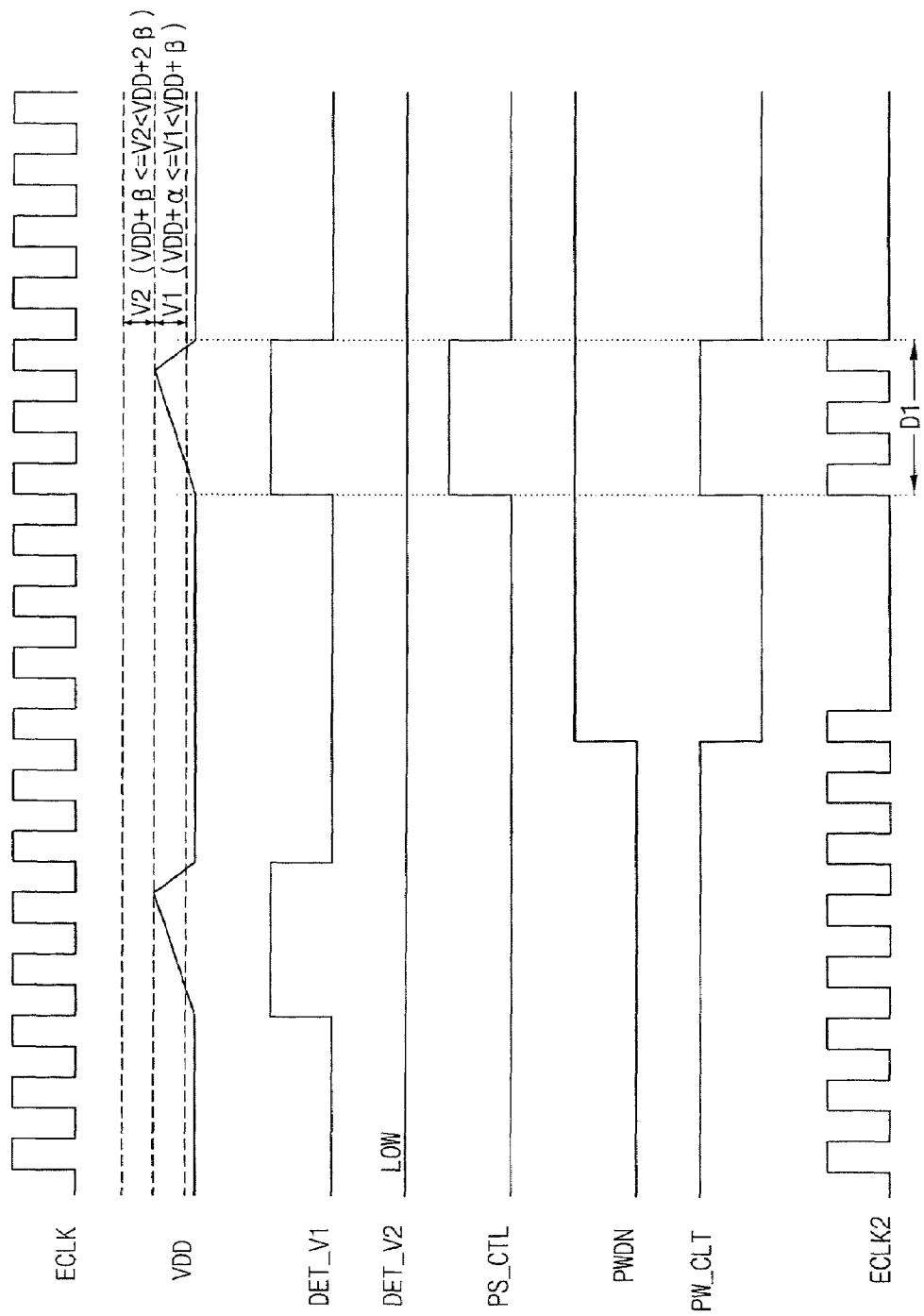

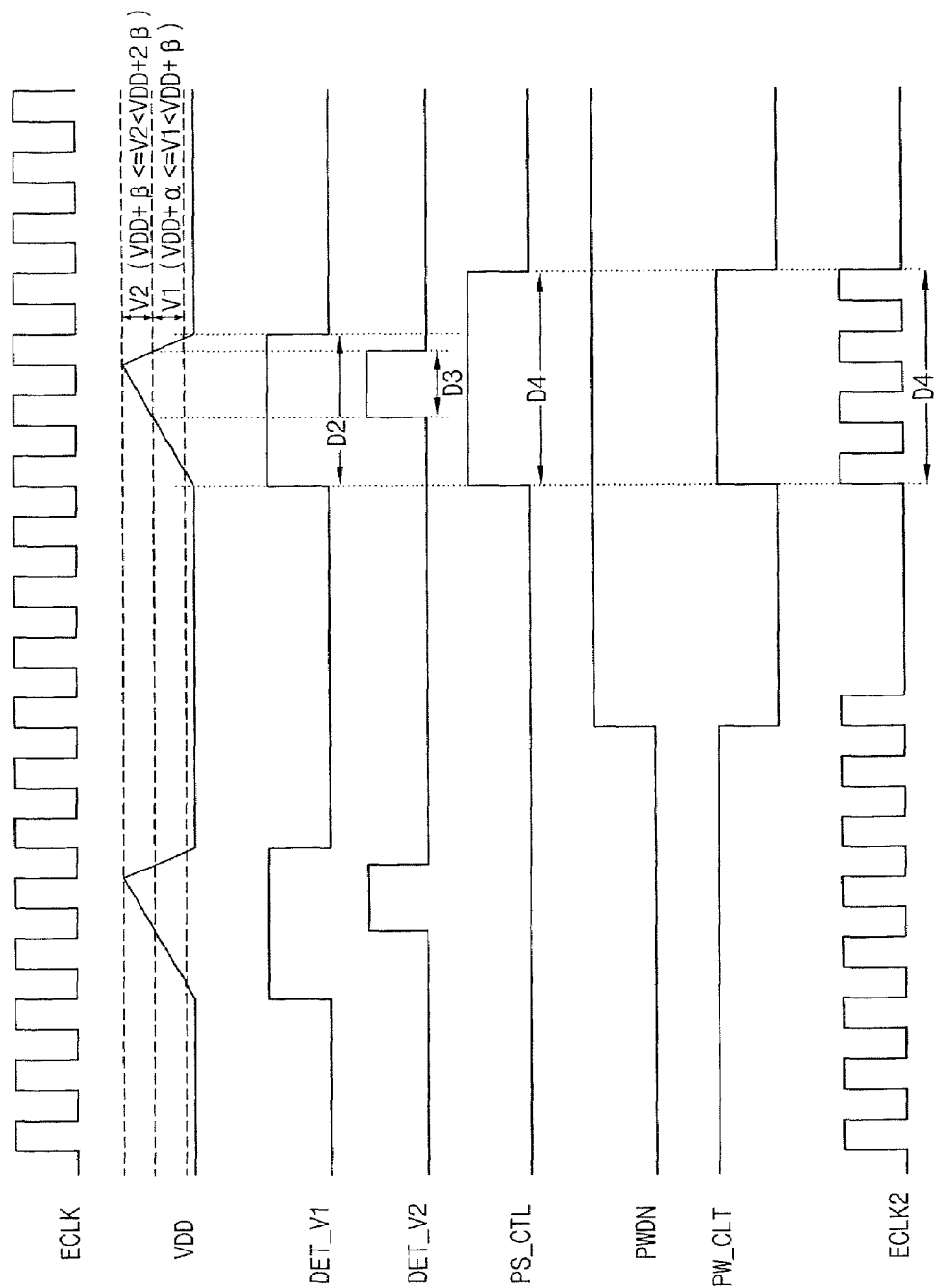

CLOCK SYNCHRONIZATION CIRCUIT AND CLOCK SYNCHRONIZATION METHOD

CROSS-REFERENCE TO RELATED APPLICATIONS

The present application claims priority to Korean patent application number 10-2007-0111368 filed on Nov. 2, 2007, which is incorporated herein by reference in its entirety.

BACKGROUND OF THE INVENTION

The present invention relates generally to a semiconductor device, and more particularly to a clock synchronization circuit and a clock synchronization method which generate an internal clock synchronized to an external clock.

In general, a synchronous semiconductor device operating in synchronization with a clock from an external system (hereinafter, "the external clock") includes a clock synchronization circuit in order to generate an internal clock of the semiconductor device (hereinafter, "the internal clocks") having the same phase as the external clock. As the clock synchronization circuit, a phase locked loop (PLL) and a delay locked loop (DLL) have been widely used.

The phase locked loop is to synchronize a phase of the internal phase with a phase of the external phase, and the delay locked loop is to synchronize the internal clock with the external clock by reflecting on the internal clock a negative delay corresponding to a delay component in a clock path of the external clock generated within the semiconductor device.

Meanwhile, the semiconductor device enters into a power-down mode when there is no access to memory cells for the purpose of low power, in which it is allowed to reduce current consumption as possible by disabling the clock synchronization circuit. Further, when the semiconductor device exits into an active mode, the clock synchronization circuit is enabled again.

Hereinafter, although the clock synchronization circuit is shown as a delay locked loop for the purpose of easiness of explanation, it should be understood that other clock synchronization circuit including a phase locked loop can be applied.

Referring to FIG. 1, a delay locked loop circuit 1 according to prior art comprises a input buffer 10 buffering and inputting an external clock ECLK, a clock enable unit 12 selectively inputting an input clock ECLK1 output from the input buffer 10 by power-down signal PWDN, a phase updating unit 14 outputting an internal clock ICLK synchronized to the external clock ECLK by updating a phase of a reference clock ECLK2 output from the clock enable unit 12, and an output buffer 16 outputting data synchronized to the internal clock ICLK output from the phase updating unit 14.

Herein, the phase updating unit 14 comprises a phase delay unit 20 inputting the reference clock ECLK2 and delaying a phase of it to output the internal clock ICLK synchronized to the external clock ECLK, a delay model unit 26 modeling the internal clock ICLK with delay elements of the clock signal within the memory to output a feedback clock FBCLK, a phase comparing unit 24 inputting the reference clock ECLK2 and the feedback clock FBCLK and detecting a phase difference between two clocks input to output a phase detect signal DET, and a delay control unit 22 inputting the phase detect signal DET and outputting a control signal CTL which controls the phase delay of the phase delay unit 20.

Referring to FIG. 2, the operations of the conventional delay locked loop circuit 1 will be described. When the semiconductor device enters into the power-down mode, a power-down signal PWDN is enabled thus transitioning from logic low to logic high. Then, the delay locked loop circuit stops a phase update operation to save current states and store the previous locking information, thereby entering into a frozen state.

Herein, the phase update means keeping track of a phase difference between the feedback clock FBCLK and the reference clock ECLK2 in the delay locked loop circuit, and the frozen state means storing the previous locking information but updating the phase.

Meanwhile, the power supply voltage VDD can have voltage sections V1, V2 of which voltage level is randomly varied due to power noise. Such power noise continues to be generated even while the delay locked loop circuit remains in the power-down mode.

Conventionally, since the delay locked loop circuit has other locking information value in accordance with a level of power supply voltage VDD, the locking information value varies considerably if a level of the power supply voltage VDD of when the delay locked loop circuit enters into power-down mode and a level of the power supply voltage VDD of when the delay locked looped circuit exits the power-down mode are different to each other.

However, since prior delay locked loop circuit does not perform a phase update operation in response to changes of the power supply voltage VDD while remaining in the power-down mode, if it exits the power-down mode at power supply voltage level other than a level of power supply voltage VDD of when entering into the power-down mode, e.g., voltage section V1 or V2, a delay of the reference clock ECLK2 is controlled by the locking information un-updated, thereby generating the internal clock ICLK.

As a result, there is a problem that the semiconductor device cannot receive/transmit available data since a phase difference between the external clock ECLK and the internal clock ICLK is caused.

SUMMARY OF THE INVENTION

The present invention provides a clock synchronization circuit and a clock synchronization method which can prevent a locking failure by performing phase update operation selectively in accordance with whether the power supply voltage is varied or not in a power-down mode.

Further, the present invention provides a clock synchronization circuit and a clock synchronization method which improve current consumption by controlling phase update time in accordance with variable size of the power supply voltage in a power-down mode.

A clock synchronization circuit according to one aspect of the present invention comprises a clock enable control circuit generating a clock enable control signal controlled by a power supply voltage and a power-down signal; and a clock generating circuit receiving an input clock and selectively generating an internal clock synchronized to an external clock using the input clock by the clock enable control signal.

Preferably, the clock enable control circuit comprises a voltage detecting unit detecting a level of the power supply voltage for each of one or more voltage sections to output a voltage detect signal corresponding to each of the voltage sections; and a clock enable control unit outputting the clock enable control signal by combining the voltage detect signal with the power-down signal.

Each voltage section enables and outputs the voltage detect signal corresponding to including the power supply voltage or having a voltage level lower than that of the power supply voltage.

The clock enable control unit enables and outputs the clock enable control signal if any one of the power-down signal and the voltage detect signal is enabled.

The clock enable control unit comprises a control pulse generating unit generating a control pulse by combining a plurality of the voltage detect signals; and a control pulse output unit inputting the control pulse and the power-down signal and outputting the clock enable control signal.

The control pulse generating unit comprises a pulse generating unit outputting a pulse with a first voltage detect signal corresponding to a voltage level defined as the first voltage section by the voltage detecting unit; and a pulse output unit enabling and outputting the control pulse if any one of a second voltage detect signal corresponding to a second voltage section defined as voltage level lower than the first voltage section and an output from the pulse generating unit is enabled.

The pulse generating unit comprises a delay unit delaying the first voltage detect signal; and an output unit enabling and outputting the pulse if any one of an output from the delay unit and the first voltage detect signal is enabled.

The clock generating circuit comprises a clock enable unit controlling the input clock by the clock enable control signal an outputting it as a reference clock; and a phase update unit updating a phase of the reference clock and outputting the internal clock synchronized to the external clock.

The phase update unit comprises a phase delay unit inputting the reference clock and delaying a phase of it to output the internal clock synchronized to the external clock; a delay model unit modeling the internal clock with delay elements of the clock signal within the memory and outputting it as a feedback clock; a phase comparing unit inputting the reference clock and the feedback clock and detecting a phase difference between two signals input to output the phase detect signal; and a delay control unit inputting the phase detect signal and controlling a phase delay of the phase delay unit.

The clock synchronization circuit further comprises an input buffer buffering the external clock to provide it as the input clock.

A clock synchronization circuit according to another aspect of the present invention comprises a clock supply unit supplying an input clock as a reference clock in response to change of a power supply voltage in a power-down mode; and a clock update unit updating a phase of the reference clock and outputting an internal clock synchronized to an external clock.

Preferably, the clock supply unit comprises a voltage detect unit detecting a level of the power supply voltage for each of sequential voltage sections and outputting voltage detect signal corresponding to the each voltage section; a clock enable control unit combining a power-down signal having entry and exit information into the power-down mode with the voltage detect signal and outputting the voltage detect signal as a clock enable control signal when the power-down signal is enabled; and a clock enable unit providing the input clock as the reference clock while the clock enable control signal is enabled.

Each voltage section enables and outputs the voltage detect signal corresponding to including the power supply voltage or having voltage level lower than the power supply voltage.

The clock enable control unit enables and outputs the clock enable control signal if any one of the power-down signal and the voltage detect signal is enabled.

The clock enable control unit comprises a control pulse generating unit generating a control pulse by combining a plurality of the voltage detect signals; and a control pulse output unit inputting the control pulse and the power-down signal and outputting the clock enable control signal.

The control pulse generating unit comprises a pulse generating unit outputting the pulse with a first voltage detect signal corresponding to a voltage level defined as the first voltage section by the voltage detecting unit; and a pulse output unit enabling and outputting the control pulse if any one of a second voltage detect signal, corresponding to a second voltage section defined as voltage level lower than the first voltage section, and an output from the pulse generating unit is enabled.

The pulse generating unit comprises a delay unit delaying the first voltage detect signal; and an output unit enabling and outputting the pulse if any one of an output from the delay unit and the first voltage detect signal is enabled.

The clock update unit comprises a phase delay unit inputting the reference clock and delaying a phase of it to output the internal clock synchronized to the external clock; a delay model unit modeling the internal clock with delay elements of the clock signal present within the memory and outputting it as a feedback clock; a phase comparing unit inputting the reference clock and the feedback clock and detecting a phase difference between two signals input to output the phase detect signal; and a delay control unit inputting the phase detect signal and controlling a phase delay of the phase delay unit.

The clock update unit is a DLL which inputs the reference clock and outputs the internal clock synchronized to the external clock.

The clock update unit is a PLL which inputs the reference clock and outputs the internal clock synchronized to the external clock.

The clock synchronization circuit further comprises an input buffer buffering the external clock and providing it as the input clock.

A clock synchronization method according to the present invention comprises steps of detecting a level of a power supply voltage for each of the voltage sections to output a voltage detect signal corresponding to the each voltage section; outputting a clock enable control signal by combining a power down signal having entry or exit information into a power down mode with the voltage detect signal; providing an input clock as a reference clock while the clock enable control signal is enabled; and delaying a phase of the reference clock to output the internal clock synchronized to the external clock.

The voltage detect signal is enabled when the voltage section includes the power supply voltage or has a voltage level lower than that of the power supply voltage.

The voltage detect signal is enabled if any one of a first voltage detect signal output in correspondence with the first voltage section and a second voltage detect signal output in correspondence with the second voltage section of voltage level lower than that of the first voltage section is enabled.

The clock enable control signal is controlled by the voltage detect signal when the power-down signal is enabled.

The present invention can prevent a locking failure by providing the clock synchronization circuit and the clock synchronization method which perform the phase update operation selectively in accordance with whether the power supply voltage is varied or not in the power-down mode.

Further, the present invention can improve current consumption by providing the clock synchronization circuit and the clock synchronization method which control the phase update time in accordance with a variable magnitude of the power supply voltage in the power-down mode.

BRIEF DESCRIPTION OF THE DRAWINGS

FIGS. 6a and 6b are operational waveform diagram of the clock synchronization circuit operating in response to a variable power supply voltage in a power-down mode according to first embodiment of the present invention.

DESCRIPTION OF SPECIFIC EMBODIMENTS

Hereinafter, preferred embodiments of the present invention will be described in detail with reference to the accompanying drawings.

The present invention discloses a clock synchronization circuit and a clock synchronization method which prevent a locking failure by performing phase update operation in response to power supply voltage noise in a power-down mode.

Figure 1:
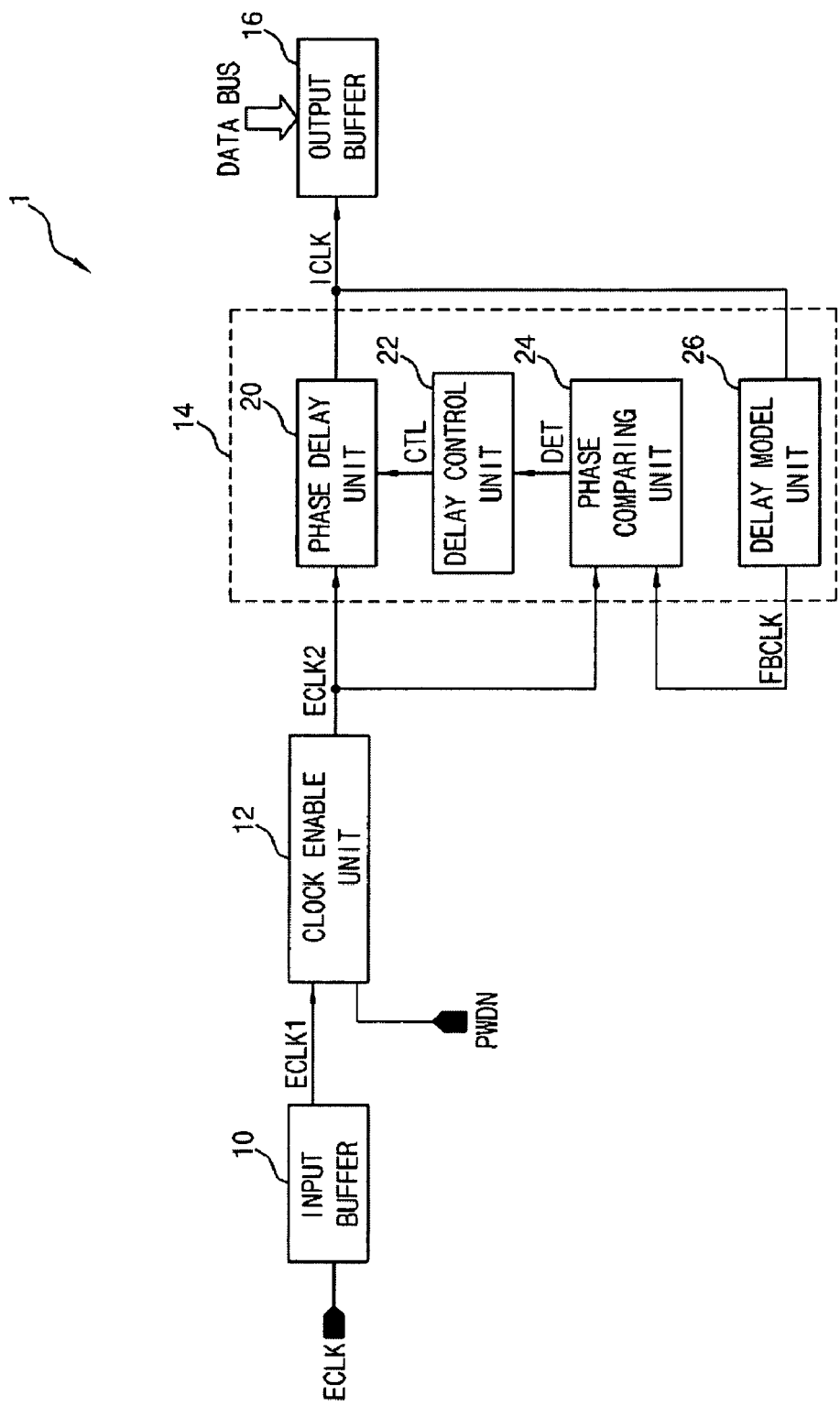
FIG. 1 is a block diagram showing a clock synchronization circuit according to a related art.
Figure 2:
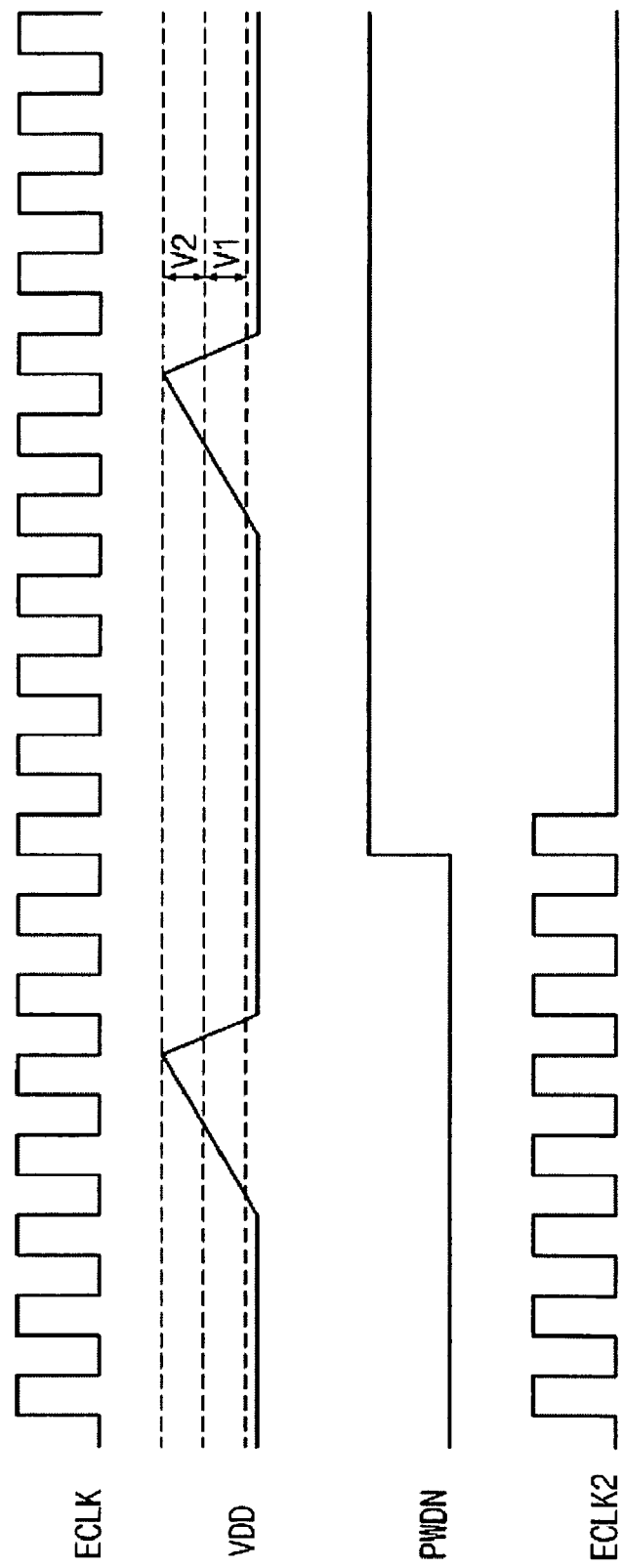
FIG. 2 is an operational waveform diagram illustrating a clock synchronization circuit operating in response to a variable power supply voltage in a power-down mode according to a related art.
Figure 3:
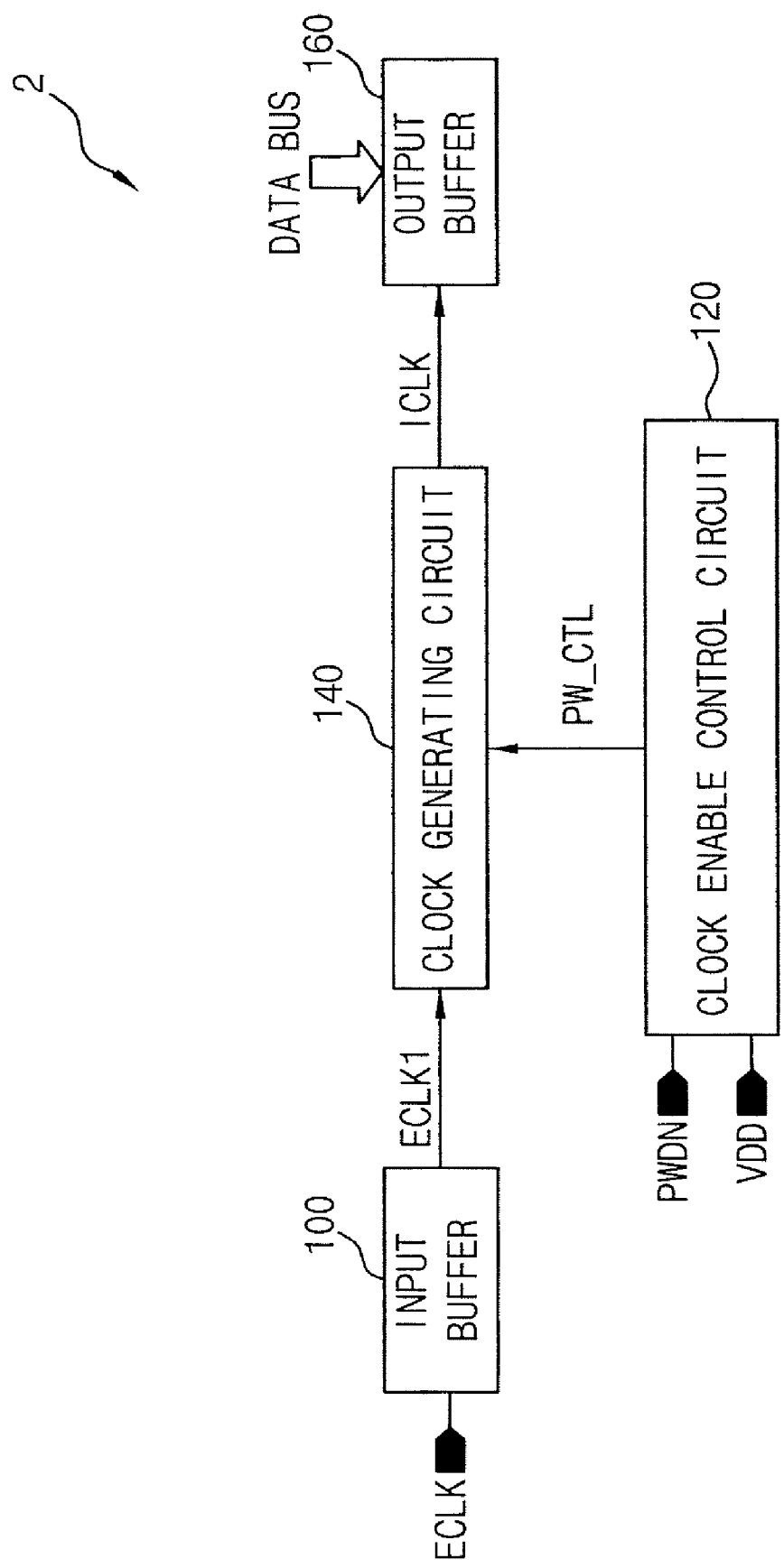
FIG. 3 is a block diagram showing a clock synchronization circuit according to first embodiment of the present invention.

Referring to FIG. 3, a delay locked loop circuit 2 according to first embodiment of the present invention includes an input buffer 100, a clock enable control circuit 120, a clock generating circuit 140 and an output buffer 160.

The input buffer 100 inputs and buffers an external clock ECLK and outputs an input clock ECLK1.

The clock enable control circuit 120 generates a clock enable control signal PW_CTL controlled by power supply voltage VDD and power-down signal PWDN and provides it to the clock generating circuit 140.

The clock generating circuit 140 receives the input clock ECLK1 selectively by the clock enable control signal PW_CTL and generates an internal clock ICLK synchronized to the external clock ECLK.

The output buffer 160 synchronizes the data from memory core with the internal clock ICLK to output it to a data output pad (not shown).

Figure 4:
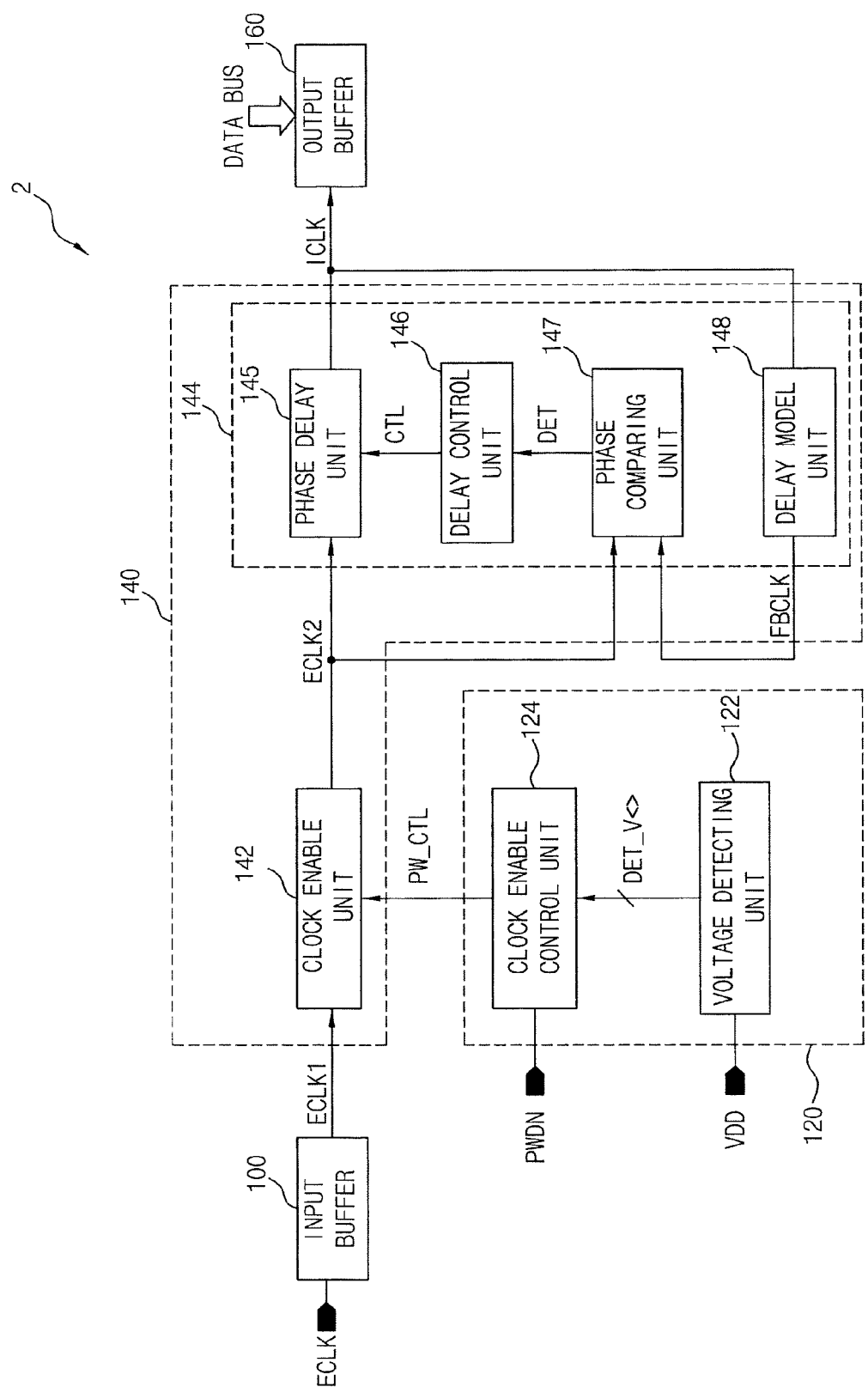
FIG. 4 is a detailed block diagram of the clock synchronization circuit of FIG. 3.

More specifically, referring to FIG. 4, the clock enable control circuit 120 comprises a voltage detecting unit 122 and a clock enable control unit 124.

The voltage detecting unit 122 sets one or more voltage sections in which a level of the power supply voltage VDD is varied due to power noise and outputs a voltage detecting signal DET_V<> corresponding to each voltage section.

Herein, the voltage detecting unit 122 enables and outputs one voltage detect signal DET_V1 while the level of the power supply voltage VDD is varied if the number of the voltage section is set as one, and enables and outputs each voltage detect signal DET_V<> corresponding to each voltage section including the varied power supply voltage VDD or having a voltage level lower than that of the varied power supply voltage VDD if the number of the voltage section is set as a large number (N: natural number).

For example, when two voltage sections V1 to V2 are set in a way of dividing the voltage level sequentially, if the level of the power voltage VDD is included in the voltage section V1, the voltage detect signal DET_V1 corresponding to the voltage section V1 is enabled and the voltage detect signal DET_V2 corresponding to the voltage section V2 is disabled.

Herein, the voltage section V1 and V2 can correspond to $VDD+\alpha \leq V1 < Vdd+\beta$, $VDD+\beta \leq V2 < Vdd+2\beta$ respectively, and the voltage section V1 is preferably set in the section where the level of the power supply voltage VDD varies at least a prescribed width $\alpha$. At this time, the prescribed width a and the variable section $\beta$ are preferably interpreted as absolute value. That is, they can be applied identically to increment and decrement of the power supply voltage VDD.

It will be appreciated that the voltage detecting unit 122 outputting the voltage detect signal DET_V<> in response to the power supply voltage VDD can be variously constructed by technology known to related art.

The clock enable control unit 124 outputs a clock enable control signal PW_CTL by combining the voltage detect signal DET_V<> with the power-down signal PWDN having entry and exit information into power-down mode.

Figure 5A:
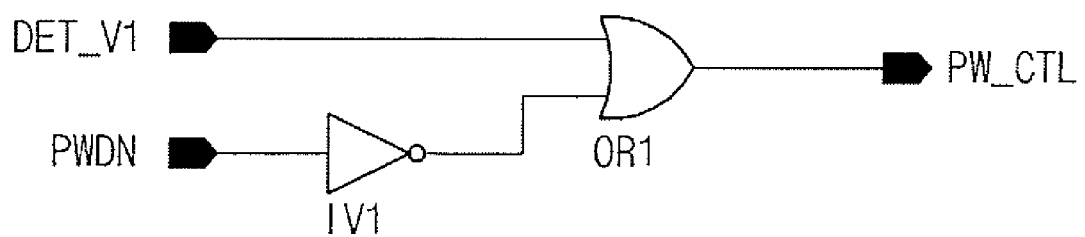
FIGS. 5a and 5b are detailed circuit diagrams of clock enable control unit of FIG. 4.
Figure 5B:
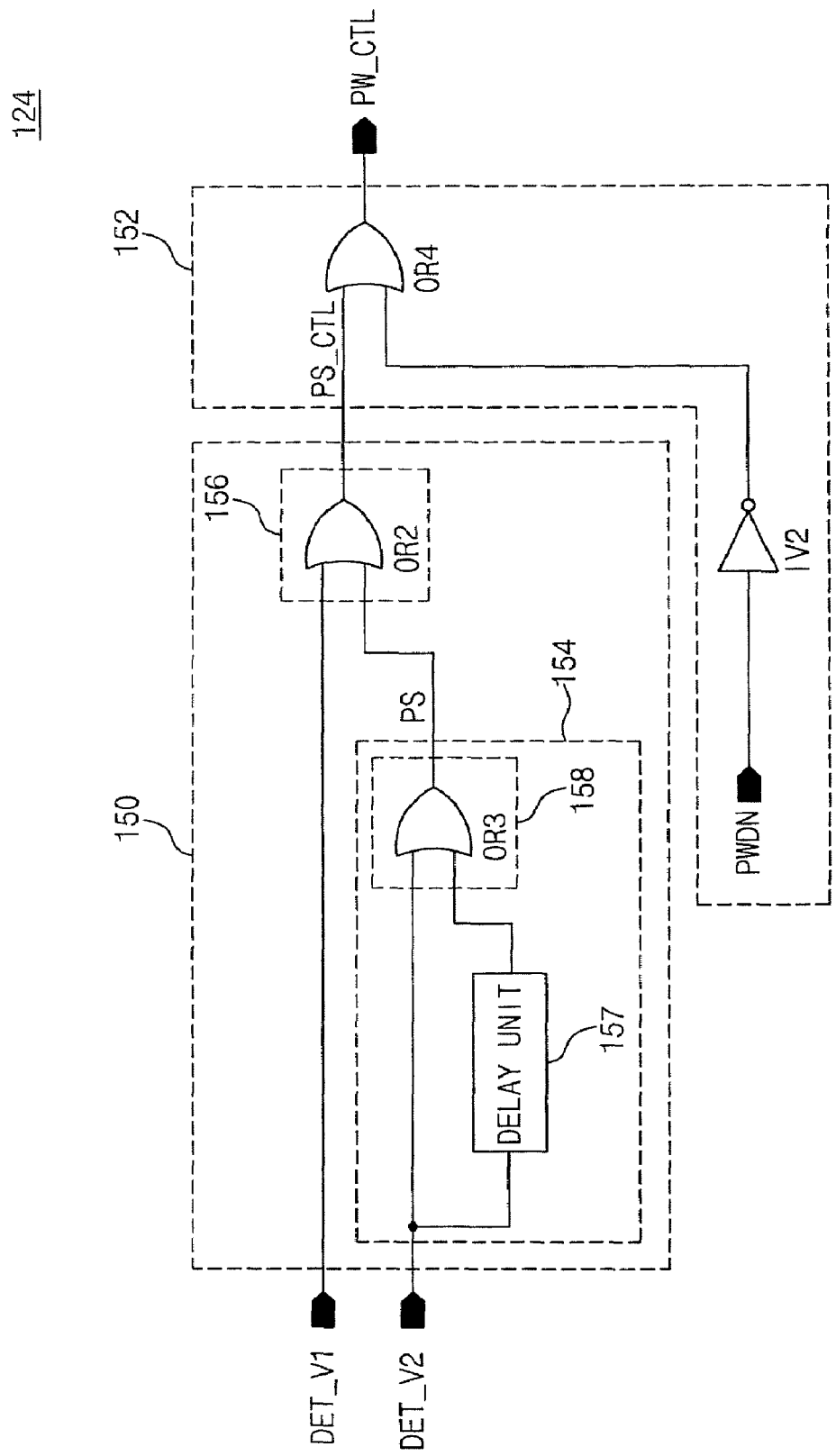

The clock enable control unit 124 can be variously constructed as shown in FIGS. 5a and 5b.

The clock enable control unit 124 shown in FIG. 5a comprises an inverter IV1 and an OR gate OR1, and receives a power-down signal PWDN and one voltage detect signal DET_V1 and outputs the clock enable control signal PW_CTL.

The inverter IV1 receives and inverts the power-down signal PWDN, and the OR gate OR1 receives an output signal from the inverter IV1 and a voltage detect signal DET_V1 applied from the voltage detecting unit 122 and enables and outputs the clock enable control signal PW_CTL if any one of two signals received is enabled.

The clock enable control signal 124 shown in FIG. 5b comprises a control pulse generating unit 150 and a control signal output unit 152, and outputs a clock enable control signal PW_CTL by a control pulse PS_CTL generated by combining a plurality of voltage detect signals DET_V(N−1), DET_V(N), in which as illustrated N=2, with the power-down signal PWDN.

For example, the control pulse generating unit 150 comprises a pulse generating unit 154 generating a pulse PS by the voltage detect signal DET_V2 output in correspondence with the first voltage section and a pulse output unit 156 outputting a control pulse PS_CTL by combining the voltage detect signal DET_V1 output in correspondence with the second voltage section of voltage level lower than that of the first voltage section with the pulse PS.

Herein, the pulse output unit 156 can be structured with an OR gate OR2 which inputs the detect signal DET_V1 and the pulse signal PS and outputs the control pulse PS_CTL if any one of two signals input is enabled.

The pulse generating unit 154 comprises a delay unit 157 delaying and outputting the voltage detect signal DET_V2 and an output unit 158 outputting the pulse signal PS by combining an output from the delay unit 157 with the voltage detect signal DET_V2.

Herein, the output unit 158 can be structured with an OR gate OR3 which inputs an output from the delay unit 157 and the voltage detect signal DET_V2 and outputs the pulse PS if any one of two signals input is enabled.

Referring to FIG. 4 again, the clock generating circuit 140 comprises a clock enable unit 142 controlling the input clock ECLK1 by the clock enable control signal PW_CTL to output the reference clock ECLK2 and a phase update unit 144 updating a phase of the reference clock ECLK2 to output the internal clock ICLK synchronized to the external clock ECLK.

The clock enable unit 142 stops outputting the input clock ECLK1 and causes the reference clock ECLK2 to be disabled at a logic low if the clock enable control signal PW_CTL is disabled, and outputs the input clock ECLK1 as the reference clock ECLK2 if the clock enable control signal PW_CTL is enabled.

The phase update unit 144 comprises a phase delay unit 145 inputting the reference clock ECLK2 and delaying a phase of it to output the internal clock ICLK synchronized to the external clock ECLK, a delay model unit 148 modeling the internal clock ICLK with delay elements of the clock signal present within the memory to output the feedback clock FBCLK, a phase comparing unit 147 inputting the reference clock ECLK2 and the feedback clock FBCLK and detecting a phase difference between two signals input to output the phase detect signal DET, and a delay control unit 146 inputting the phase detect signal DET and outputting the phase control signal CTL which controls a phase delay of the reference clock ECLK2 provided to the phase delay unit 145.

The operation of the clock synchronization circuit 2 according to the present invention will be described referring to FIGS. 6a and 6b.

For easiness of explanation, though the voltage sections where the power supply voltage VDD is varied due to power noise are set as two voltage sections V1, V2, it will be appreciated that the number of the voltage sections can be incremented or decremented in accordance with designer's intention.

As shown in FIG. 6a, if the level of the power supply voltage VDD is varied within the voltage section V1 due to power noise, the voltage detecting unit 122 detects the level of the power supply voltage VDD and enables the voltage detect signal DET_V1 at a logic high to output it if the level is included in the voltage section V1.

That is, the voltage detect signal DET_V1 is enabled at a logic high during a time D1 when the level of the power supply voltage VDD is varied within the voltage section V1. At this time, the voltage detect signal DET_V2 corresponding to the voltage section V2 remains in a disabled stage at a logic low.

Subsequently, the clock enable control unit 124 outputs the clock enable control signal PW_CTL by combining the power-down signal PWDN having entry and exit information into the power-down mode with the voltage detect signals DET_V1, DTE_V2.

For example, the clock enable control signals PW_CTL is enabled regardless of the voltage detect signals DET_V1, DET_V2 in a case of a normal mode, i.e., if the power-down signal PWDN is disabled, and enabled selectively in accordance with the voltage detect signals DET_V1, DET_V2 in a case of the power-down mode, i.e., if the power-down signal PWDN is enabled.

That is, the clock enable control signal PW_CTL is enabled during a time D1 when the voltage detect signal DET_V1 is enabled at a logic high in power-down state in which the power-down signal PWDN is enabled.

Subsequently, the clock enable unit 142 provides the input clock ELCK1 as the reference clock ECLK2 during a time D1 when the clock enable control signal PW_CTL is enabled, and the phase update unit 144 performs locking update operation outputting the internal clock ICLK synchronized to the external clock ELCK by delaying the phase of the reference clock ECLK2.

As shown in FIG. 6b, if the level of the power supply voltage VDD is varied across the voltage section V1 and V2 due to power noise, the voltage detecting unit 122 detects the level of the power supply voltage VDD and causes the voltage detect signal DET_V1 to be enabled at a logic high and output if the level is included in or over the voltage section V1. Similarly, if the level of the power supply voltage VDD is included in the voltage section V2, the voltage detecting unit 122 causes the voltage detect signal DET_2 to be enabled at a logic high and output.

More specifically, the voltage detect signal DET_V1 is enabled at a logic high during a time D2 when the level of the power supply voltage VDD is included in or varied over the voltage section V1, and the voltage detect signal DET_V2 is enabled at a logic high during a time D3 when the level of the power supply voltage VDD is varied in the voltage section V2.

Subsequently, the clock enable control unit 124 outputs the clock enable control signal PW_CTL enabled selectively in accordance with the voltage detect signals DET_V1, DET_V2 in a power-down state in which the power-down signal PWDN is enabled.

That is, the clock enable control signal PW_CTL is enabled during a section D4 where a control pulse PS_CTL generated by the voltage detect signals DET_V1, DET_V2 is enabled. Herein, control pulse PS_CTL is generated by the control pulse generating unit 150 of FIG. 4b, in which the section D4 where the control pulse PS_CTL is enabled is preferably set larger than the section D2 where the voltage detect signal DET_V1 is enabled.

Subsequently, the clock enable unit 142 provides the input clock ECLK1 as the reference clock ECLK2 during the section D4 where the clock enable control signal PW_CTL is enabled, and the phase update unit 144 performs locking update operation outputting the internal clock ICLK synchronized to the external clock ECLK by delaying the phase of the reference clock ECLK2.

In summary, the clock synchronization circuit performs locking update selectively in accordance with whether the power supply voltage VDD is varied or not in the power-down mode and outputs the internal clock synchronized to the external clock in the normal operation after the power-down mode, thereby preventing a data output failure caused by a locking failure.

Further, the clock synchronization circuit according to the present invention can improve current consumption by controlling locking update time in accordance with a variable magnitude of the power supply voltage VDD in the power-down mode and output the internal clock synchronized to the external clock during the normal operation after the power-down mode.

Figure 7:
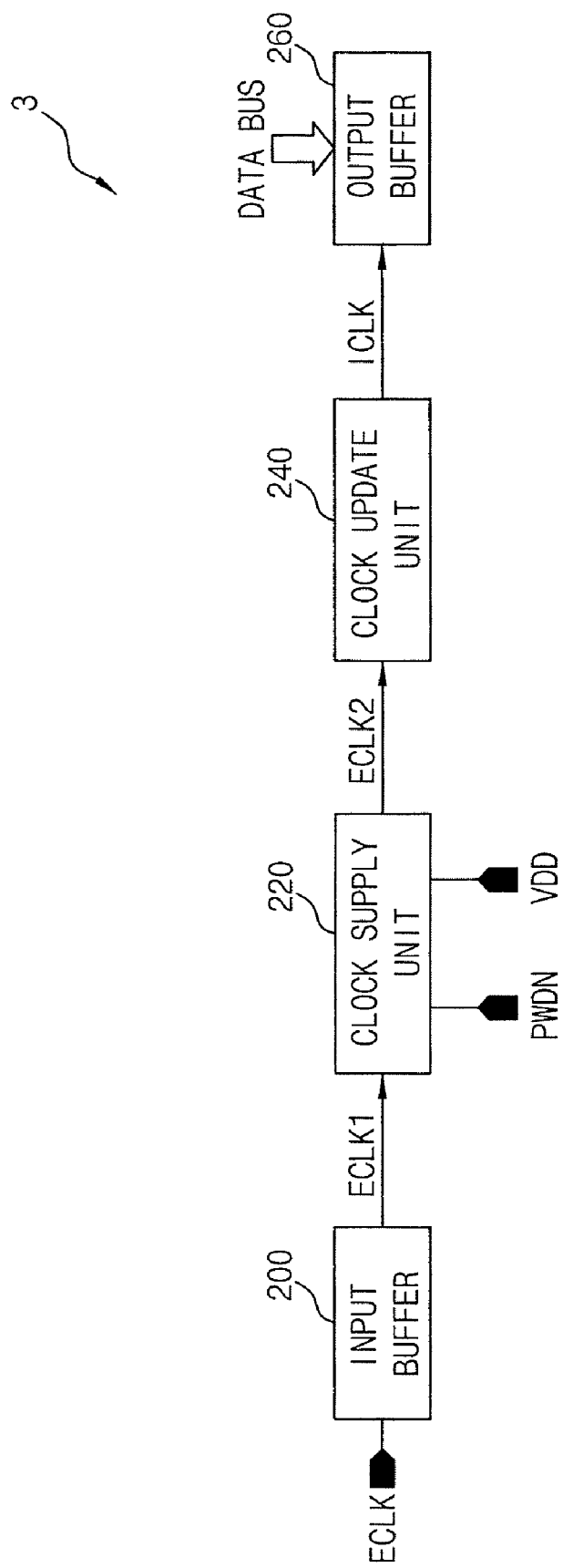
FIG. 7 is a block diagram showing a clock synchronization circuit according to second embodiment of the present invention.

The delay locked loop circuit according to second embodiment of the present invention can be provided as shown in FIG. 7.

Referring to FIG. 7, the delay locked loop circuit 3 according to the second embodiment of the present invention comprises an input buffer 200, a clock supply unit 220, a clock update unit 240 and an output buffer 260.

The input buffer 200 inputs and buffers the external clock ECLK and outputs an input clock ECLK1.

The clock supply unit 220 generates a clock enable control signal PW_CTL enabled selectively in response to changes of the power supply voltage VDD in the power-down mode, and provides the input clock ECLK1 as the reference clock ECLK2 by the clock enable control signal PW_CTL.

The clock update unit 240 updates a phase of the reference clock ECLK2 and outputs the internal clock ICLK synchronized to the external clock ECLK.

The output buffer 260 synchronizes the data from memory core with the internal clock ICLK and outputs it to the data output pad (not shown).

Herein, the clock supply unit 220 can comprise the voltage detect unit 122, the clock enable control unit 124 and the clock enable unit 142 as shown in FIG. 4. And, the clock update unit 240 can comprise the phase delay unit 145, the delay model unit 148, the phase comparing unit 147, and the delay control unit 146 as shown in FIG. 4.

The clock synchronization circuit 3 structured as above-mentioned according to second embodiment of the present invention is such that the clock supply unit 220 can supply the input clock ECLK1 as the reference clock ECLK2 selectively in response to changes of the power supply voltage VDD in the power-down mode and the clock update unit 240 can output the internal clock synchronized to the external clock during the normal operation after the power-down mode by updating the phase of the internal clock ICLK in order to be synchronized to the external clock ECLK while the reference clock ECLK2 is enabled.

Though the delay locked loop circuit DLL was disclosed in the above embodiments, it will be appreciated that the clock synchronization circuit including a phase locked loop circuit PLL can be applied.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A clock synchronization circuit comprising:
   a clock enable control circuit generating a clock enable control signal, the clock enable control circuit being controlled by a power supply voltage and by a power-down signal to selectively enable the clock enable control signal during a power-down mode; and
   a clock generating circuit receiving an input clock and selectively generating an internal clock synchronized to an external clock using the input clock and the clock enable control signal.

2. The clock synchronization circuit as set forth in claim 1, wherein the clock enable control circuit comprises:
   a voltage detecting unit detecting a level of the power supply voltage for each of one or more voltage sections to output a voltage detect signal corresponding to each of the voltage sections; and
   a clock enable control unit outputting the clock enable control signal by combining the voltage detect signal with the power-down signal.

3. The clock synchronization circuit as set forth in claim 2, wherein the voltage detecting unit enables the voltage detect signal corresponding to each of the one or more voltage sections that includes either the level of the power supply voltage detected by the voltage detecting unit or a voltage level lower than the level of the power supply voltage.

4. The clock synchronization circuit as set forth in claim 2, wherein the clock enable control unit enables and outputs the clock enable control signal when the power-down signal is disabled, and wherein the clock enable control unit enables and outputs the clock enable control signal when the voltage detect signal is enabled.

5. The clock synchronization circuit as set forth in claim 2, wherein the clock enable control unit comprises:

a control pulse generating unit generating a control pulse by combining a plurality of the voltage detect signals; and
a control pulse output unit inputting the control pulse and the power-down signal and outputting the clock enable control signal.

6. The clock synchronization circuit as set forth in claim 5, wherein the control pulse generating unit comprises:
   a pulse generating unit outputting a pulse in response to a first voltage detect signal, the first voltage detect signal being the voltage detect signal corresponding to a first voltage section of the one or more voltage sections; and
   a pulse output unit enabling and outputting the control pulse both when a second voltage detect signal is enabled and when the pulse output from the pulse generating unit is enabled, wherein the second voltage detect signal is the voltage detect signal corresponding to a second voltage section of the one or more voltage sections and the second voltage section includes a voltage level lower than voltage levels included in the first voltage section.

7. The clock synchronization circuit as set forth in claim 6, wherein the pulse generating unit comprises:
   a delay unit delaying the first voltage detect signal; and
   an output unit enabling and outputting the pulse when any one of an output from the delay unit and the first voltage detect signal is enabled.

8. The clock synchronization circuit as set forth in claim 1, wherein the clock generating circuit comprises:
   a clock enable unit controlling the input clock using the clock enable control signal and outputting the input clock as a reference clock; and
   a phase update unit updating a phase of the reference clock and outputting the internal clock synchronized to the external clock.

9. The clock synchronization circuit as set forth in claim 8, wherein the phase update unit comprises:
   a phase delay unit inputting the reference clock and delaying a phase of the reference clock to output the internal clock synchronized to the external clock;
   a delay model unit modeling the internal clock using delay elements of the clock signal within the memory and outputting the internal clock as a feedback clock;
   a phase comparing unit inputting the reference clock and the feedback clock and detecting a phase difference between the reference and feedback clocks and outputting a phase detect signal; and
   a delay control unit inputting the phase detect signal and controlling a phase delay of the phase delay unit.

10. The clock synchronization circuit as set forth in claim 1, further comprising an input buffer buffering the external clock to provide the external clock as the input clock.

11. A clock synchronization circuit, comprising:
    a clock supply unit supplying an input clock as a reference clock in response to a change of a power supply voltage in a power-down mode; and
    a clock update unit updating a phase of the reference clock and outputting an internal clock synchronized to an external clock.

12. The clock synchronization circuit as set forth in claim 11 wherein the clock supply unit comprises:
    a voltage detect unit detecting a level of the power supply voltage for each of one or more sequential voltage sections and outputting a voltage detect signal corresponding to each voltage section;
    a clock enable control unit combining a power-down signal having entry and exit information into the power-down mode with the voltage detect signal and outputting the voltage detect signal as a clock enable control signal when the power-down signal is enabled; and a clock enable unit providing the input clock as the reference clock while the clock enable control signal is enabled.

13. The clock synchronization circuit as set forth in claim 12, wherein the voltage detecting unit enables the voltage detect signal corresponding to each of the one or more sequential voltage sections that includes either the power supply voltage detected by the voltage detecting unit or a voltage level lower than the level of the power supply voltage.

14. The clock synchronization circuit as set forth in claim 12, wherein the clock enable control unit enables and outputs the clock enable control signal when the power-down signal is disabled, and wherein the clock enable control unit enables and outputs the clock enable control signal when the voltage detect signal is enabled.

15. The clock synchronization circuit as set forth in claim 12, wherein the clock enable control unit comprises:

a control pulse generating unit generating a control pulse by combining a plurality of the voltage detect signals; and a control pulse output unit inputting the control pulse and the power-down signal and outputting the clock enable control signal.

16. The clock synchronization circuit as set forth in claim 15, wherein the control pulse generating unit comprises:

a pulse generating unit outputting a pulse in response to a first voltage detect signal, the first voltage detect signal being the voltage detect signal corresponding to a first voltage section of the one or more voltage sections; and a pulse output unit enabling and outputting the control pulse when a second voltage detect signal is enabled, wherein the second voltage detect signal is the voltage detect signal corresponding to a second voltage section of the one or more voltage sections and the second voltage section includes a voltage level lower than voltage levels included in the first voltage section.

17. The clock synchronization circuit as set forth in claim 16, wherein the pulse generating unit comprises:

a delay unit delaying the first voltage detect signal; and an output unit enabling and outputting the pulse when any one of an output from the delay unit or the first voltage detect signal is enabled.

18. The clock synchronization circuit as set forth in claim 12, wherein the clock update unit is a PLL which inputs the reference clock and outputs the internal clock synchronized to the external clock.

19. The clock synchronization circuit as set forth in claim 11, wherein the clock update unit comprises:

a phase delay unit inputting the reference clock and delaying the phase of the reference clock and outputting the internal clock synchronized to the external clock;

a delay model unit modeling the internal clock with delay elements of the clock signal present within a memory and outputting the internal clock as a feedback clock;

a phase comparing unit inputting the reference clock and the feedback clock and detecting a phase difference between the reference and feedback clocks and outputting a phase detect signal; and a delay control unit inputting the phase detect signal and controlling a phase delay of the phase delay unit.

20. The clock synchronization circuit as set forth in claim 11, wherein the clock update unit is a DLL which inputs the reference clock and outputs the internal clock synchronized to the external clock.

21. The clock synchronization circuit as set forth in claim 11, further comprising an input buffer buffering the external clock and providing the buffered external clock as the input clock.

22. A clock synchronization method, comprising steps of:

detecting a level of a power supply voltage for each of one or more voltage sections to output a voltage detect signal corresponding to each voltage section;

outputting a clock enable control signal by combining a power-down signal having entry or exit information into a power down mode with the voltage detect signal so as to selectively enable the clock enable control signal between entry and exit of the power down mode;

providing an input clock as a reference clock while the clock enable control signal is enabled; and delaying a phase of the reference clock to output an internal clock synchronized to the external clock.

23. The clock synchronization method as set forth in claim 22, wherein the voltage detect signal is enabled when the voltage section includes the power supply voltage or has a voltage level lower than the power supply voltage.

24. The clock synchronization method as set forth in claim 23, wherein the clock enable control signal is controlled by the voltage detect signal when the power-down signal is enabled.

25. The clock synchronization method as set forth in claim 22, wherein a first voltage detect signal is enabled depending upon the detected level of the power supply voltage and a value of a first voltage section of the one or more voltage sections, and a second voltage detect signal is enabled depending upon the detected level of the power supply voltage and a value of a second voltage section of the one or more voltage sections, and wherein the second voltage section includes voltage levels lower than that of the first voltage section.

* * * * *